United States Patent
Liu

(10) Patent No.: US 6,702,489 B2
(45) Date of Patent: Mar. 9, 2004

(54) INKING APPARATUS WITH MULTI-POSITIONING CAPABILITY

(75) Inventor: Chia-Ping Liu, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/190,074

(22) Filed: Jul. 3, 2002

(65) Prior Publication Data

US 2004/0005181 A1 Jan. 8, 2004

(51) Int. Cl.⁷ ............... B41J 1/56; B41J 2/17; B41F 31/00
(52) U.S. Cl. ............ 400/175; 101/335; 101/364; 101/485; 347/84; 347/85; 346/140.1; 346/141
(58) Field of Search .............. 400/175; 101/335, 101/364, 485; 347/84, 85; 346/140.1, 141

(56) References Cited

U.S. PATENT DOCUMENTS

| | | | | |
|---|---|---|---|---|
| 4,568,879 A | * | 2/1986 | Nakamura et al. | 324/158 |
| 4,992,729 A | * | 2/1991 | Nadeau | 324/158 |
| 5,455,605 A | * | 10/1995 | David et al. | 346/141 |
| 6,049,203 A | * | 4/2000 | Jung | 324/158.1 |

* cited by examiner

*Primary Examiner*—Andrew H. Hirshfeld
*Assistant Examiner*—Marvin P. Crenshaw
(74) *Attorney, Agent, or Firm*—Tung & Associates

(57) ABSTRACT

An inking apparatus including an inking head which is manually adjustable in the X, Y and Z directions to facilitate quick and easy positioning of an inking probe in proximity to a defective die on a semiconductor wafer to ink and mark the die for exclusion from further processing. A horizontal positioning plate is horizontally adjustably mounted on a base plate, and an angular adjustment arm is angularly adjustably mounted on the horizontal positioning plate. The inking head is vertically adjustably mounted on the end of the angular adjustment arm and carries an ink reservoir from which ink is dispensed through an inking probe to the dies on the wafer.

9 Claims, 2 Drawing Sheets

INKING APPARATUS WITH MULTI-POSITIONING CAPABILITY

FIELD OF THE INVENTION

The present invention relates to devices used in the testing and inking of dies fabricated on a semiconductor wafer substrate. More particularly, the present invention relates to an inking apparatus which has multi-positioning and adjusting capability in the inking of multiple, disparately-located defective dies on a semiconductor wafer substrate.

BACKGROUND OF THE INVENTION

A conventional method used by the semiconductor industry in the manufacturing of semiconductor integrated circuits includes the steps of fabrication, wafer sort, assembly and test, respectively. In the fabrication step, as many as several thousand dies (integrated circuits) are formed onto a semiconductor wafer. In the wafer sort step, each of the dies on the wafer is tested to determine its electrical characteristics and operability, and defective dies are distinguished from operable dies. The defective dies are often marked by an ink mark at the wafer sorting step. In the assembly step, the unmarked, operable dies are assembled into a package, and in the test step, the packaged integrated circuits are tested for operability and reliability.

At the wafer sort step, the dies are tested to establish which dies on the wafer function properly. Each die is tested to all functional product specifications for both DC and AC parameters. Four testing objectives are pursued: (1) chip functionality, in which all chip functions are tested to ensure that only fully-functional chips are assembled and packaged in subsequent steps; (2) chip sorting, in which chips are separated or sorted on the basis of their operating speed performance under various voltage and timing conditions; (3) fab yield response, which yields important information that may lead to improvements in the overall fabrication process; and (4) test coverage, in which high test coverage of the internal device nodes is achieved at the lowest possible cost. The wafer sort procedure is similar to the in-line parametric test except that every die on the wafer is tested, in many cases using the same automated test equipment (ATE). Furthermore, the wafer sort procedure is usually located in a separate facility under less stringent purity conditions than those in which the parametric test is carried out, since wafer fabrication is essentially complete.

In automated wafer handling during wafer sort, a correlation wafer is used to verify tester setup. The correlation wafer is a control wafer the functionality of which has been verified and ensures that the testing system is working properly. After indexing from the cassette to the prober, the wafers are mounted on a vacuum chuck with Z (vertical) positioning. Using software, mechanical probe needles are aligned and contacted with bond pads on the wafer to establish electrical communication between the testing equipment and the dies on the wafer. The probes are interfaced with the ATE to perform the range of AC functional tests based on test algorithms. The type, number and order of tests are defined by the test program.

After testing, die found to be defective are labeled in a computer database to exclude the die from subsequent packaging steps. The labeling method is typically performed by placing a drop of ink on each unacceptable die. Because the ink marking process can be messy and introduce possible contaminants onto the chip, electronic wafer maps are increasingly being used to create a computer image of chip location and test results to categorize good and bad die on the wafer. At the chip assembly stations, the electronic wafer maps are downloaded into an equipment database to ensure that defective chips will not be packaged.

Typically, the die on a wafer are inked by operation of an inking head the position of which over the wafer is automatically controlled using a software-actuated controller. In the inking of multiple dies at separate locations on the wafer, the ink head must be moved between multiple positions on the wafer by operation of the software-controlled controller. However, this procedure is time-consuming and inefficient. An apparatus is therefore needed which facilitates manual multi-positioning capability of the ink head over the wafer for inking multiple, disparately-spaced die on the wafer.

SUMMARY OF THE INVENTION

An object of the present invention is to provide an inking apparatus which has multi-positioning capability in the inking of defective dies on a semiconductor wafer.

Another object of the present invention is to provide an inking apparatus which may be manually-operated.

Still another object of the present invention is to provide an inking apparatus which reduces the amount of time required for inking multiple dies on a semiconductor wafer.

Yet another object of the present invention is to provide an apparatus which facilitates quick and yet accurate adjustment of an inking probe in the inking of defective dies on a semiconductor wafer.

A still further object of the present invention is to provide an apparatus having an inking head which can be adjusted in the X, Y and Z directions as needed in inking multiple, disparately-located, defective dies on a semiconductor wafer.

In accordance with these and other objects and advantages, the present invention comprises an inking apparatus including an inking head which is manually adjustable in the X, Y and Z directions to facilitate quick and easy positioning of an inking probe in proximity to a defective die on a semiconductor wafer to ink and mark the die for exclusion from further processing. A horizontal positioning plate is horizontally adjustably mounted on a base plate, and an angular adjustment arm is angularly adjustably mounted on the horizontal positioning plate. The inking head is vertically adjustably mounted on the end of the angular adjustment arm and carries an ink reservoir from which ink is dispensed through an inking probe to the dies on the wafer.

BRIEF DESCRIPTION OF THE DRAWINGS

The invention will now be described, by way of example, with reference to the accompanying drawings, in which.

DESCRIPTION OF THE PREFERRED EMBODIMENTS

Figure 1:
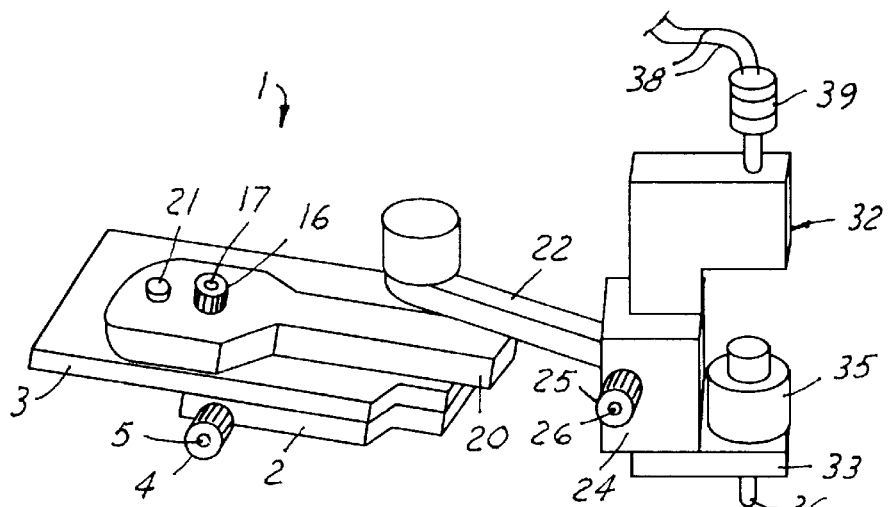
FIG. 1 is a perspective view of an illustrative embodiment of the present invention.
Figure 2:
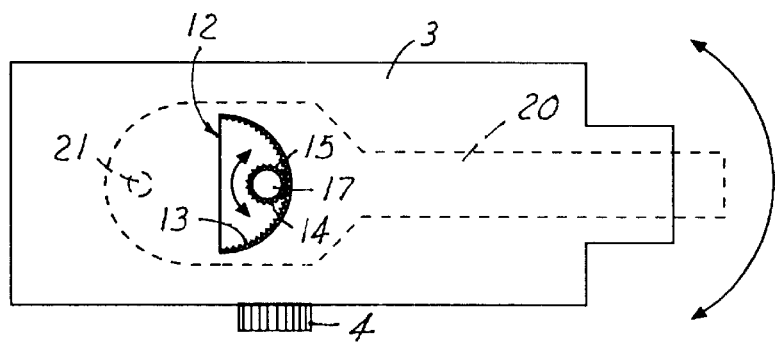
FIG. 2 is a top view of the horizontal positioning plate and angular adjustment arm (in phantom) elements of the present invention, more particularly illustrating an illustrative technique for adjustably mounting the angular adjustment arm on the horizontal positioning plate.
Figure 3:
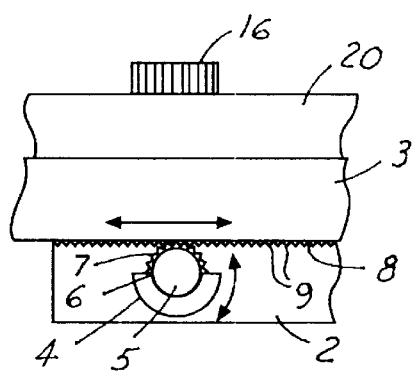
FIG. 3 is a side view of the base plate, horizontal positioning plate and angular adjustment arm elements, in section, of the present invention, more particularly illustrating a rack and pinion technique as one example of a mechanism for facilitating horizontal adjustment of the horizontal positioning plate on the base plate.

Referring initially to FIGS. 1–4 and 8 of the drawings, an illustrative embodiment of the inking apparatus of the present invention is generally indicated by reference numeral 1. The inking apparatus 1 includes a base plate 2, on which is slidably mounted an elongated horizontal positioning plate 3 by techniques known by those skilled in the art. A horizontal positioning knob 4 includes a knob shaft 5 which extends through a horizontal shaft opening (not illustrated) provided in the side of the base plate 2. As illustrated in FIG. 3, a pinion 6 fitted with multiple pinion teeth 7 is mounted on the knob shaft 5, and the pinion teeth 7 mesh with the multiple rack teeth 9 of a horizontal positioning rack 8 provided on the bottom surface of the horizontal positioning plate 3. Accordingly, as further illustrated in FIG. 3, the horizontal positioning plate 3 is mounted for bidirectional horizontal sliding movement on the underlying base plate 2 as the horizontal positioning knob 4 is rotated in the clockwise or counterclockwise direction to progressively mesh the pinion teeth 7 with the rack teeth 9. In a typical embodiment, the horizontal positioning rack 8 may be 4000 mm in length to facilitate a 4000 mm extension of the horizontal positioning plate 3 with respect to the base plate 2.

Figure 8:
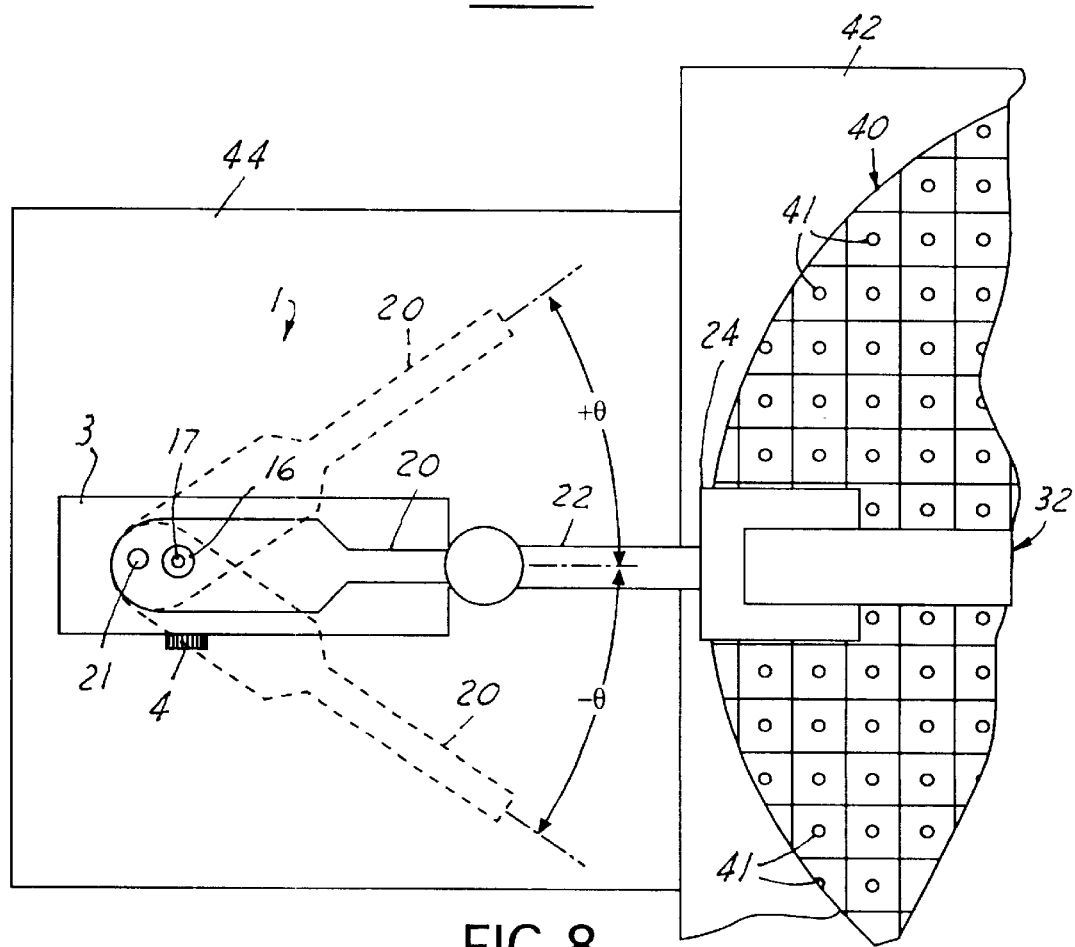
FIG. 8 is a top view of the apparatus of the present invention, more particularly illustrating multiple alternative positions of the angular adjustment arm in the inking of dies on a semiconductor wafer.

As further illustrated in FIG. 1, an elongated angular adjustment arm 20 is pivotally mounted on the upper surface of the horizontal positioning plate 3 by means of a pivot pin 21. An angular adjustment knob 16 includes a knob shaft 17 which extends through a shaft opening (not illustrated) provided in the angular adjustment arm 20 and on which is mounted a pinion 14, as illustrated in FIG. 2. The pinon 14 has pinion teeth 15 which mesh with teeth 13 provided along the edge of a crescent-shaped or semicircular angular adjustment opening 12 extending through the horizontal positioning plate 3. Accordingly, as illustrated in FIG. 8, the angular adjustment arm 20 is capable of being positioned at selected angles "+θ" or "−θ" with respect to a longitudinal axis extending through the angular adjustment arm 20, by rotating the angular adjustment knob 16 in the clockwise or counterclockwise direction, whereupon the pinion teeth 15 of the pinion 14 progressively mesh with the teeth 13 as the rotating pinion 14 traverses the arcuate edge of the angular adjustment opening 12 in the horizontal positioning plate 3. Typically, the angle "+θ" and the angle "−θ" may have a value up to about 30 degrees, and the angular adjustment arm 20 can be positioned at any angle "+θ" or "−θ" typically up to about 30 degrees by rotating the angular adjustment knob 16 in the counterclockwise or clockwise direction, respectively.

Figure 4:
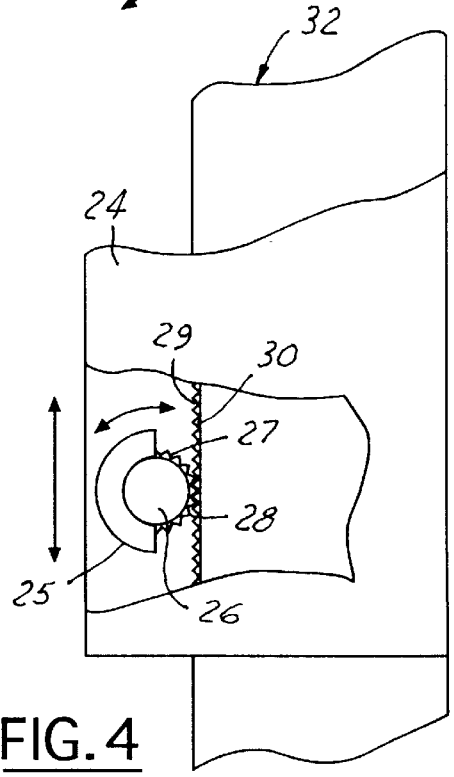
FIG. 4 is a side view of the inking head element of the present invention, more particularly illustrating a rack and pinion technique as one example of a mechanism for vertically adjustably mounting the inking head on the apparatus.
Figure 5:
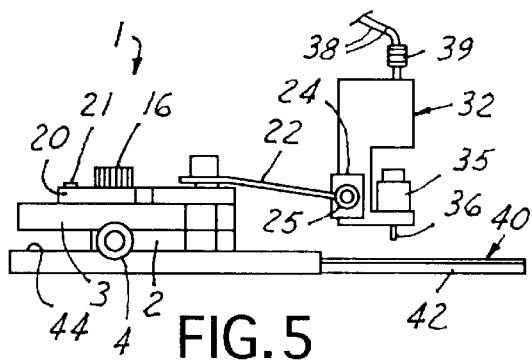
FIG. 5 is a side view of the apparatus of the present invention, with the inking head element of the apparatus disposed in a raised position above a semiconductor wafer preparatory to inking a die or dies on the wafer.
Figure 6:
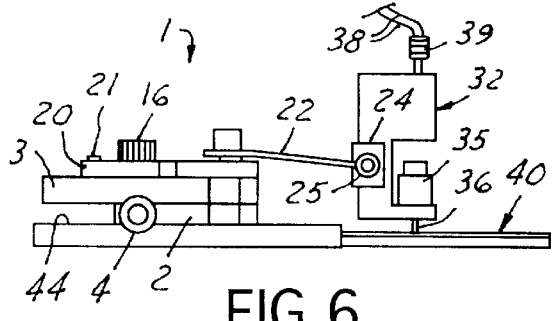
FIG. 6 is a side view of the apparatus of the present invention, with the inking head shown lowered into contact with the semiconductor wafer in a typical die-inking operation.
Figure 7:
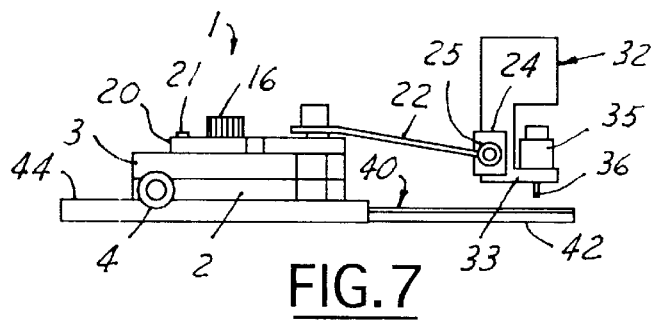
FIG. 7 is a side view of the apparatus of the present invention, with the inking head shown adjusted to a horizontally-forward position with respect to the position illustrated in FIG. 6.

A support arm 22 typically angles downwardly from the extending end of the angular adjustment arm 20 and is typically welded or otherwise attached to the angular adjustment arm 20. A vertical adjustment bracket 24 terminates the extending end of the support arm 22, and a substantially "C"-shaped inking head 32 is friction-fitted in the vertical adjustment bracket 24, according to the knowledge of those skilled in the art. A vertical adjustment knob 25 includes a knob shaft 26 which extends horizontally through a shaft opening (not illustrated) provided in the vertical adjustment bracket 24. As illustrated in FIG. 4, a pinion 27 having multiple pinion teeth 28 is mounted on the knob shaft 26, and the pinion teeth 28 mesh with rack teeth 30 of a vertical adjustment rack 29 provided along a vertical edge of the inking head 32. Accordingly, up or down sliding vertical adjustment of the inking head 32 through the vertical adjustment bracket 24 is facilitated by clockwise or counterclockwise rotation, respectively, of the vertical adjustment knob 25, thereby causing the pinion teeth 28 to progressively mesh with the rack teeth 30 on the vertical adjustment rack 29.

The inking head 32 includes a horizontal support plate 33 which supports an ink reservoir 35, which may be a bottle or other container that holds a supply of ink for inking defective dies 41 on a semiconductor wafer 40, as illustrated in FIG. 8 and hereinafter further described. An inking probe 36 which communicates with the ink reservoir 35 extends downwardly through the support plate 33 for dispensing the ink from the ink reservoir 35 to the dies 41. Controller wiring 38 extends from a controller (not shown) and may be connected to a transducer 39 which is operably connected to the ink reservoir 35 for dispensing ink from the reservoir 35 onto the defective die or dies 41 through the inking probe 36.

It is understood that any system known by those skilled in the art may be used in conjunction with the inking head 32 to dispense the ink from the ink reservoir 35. Accordingly, the controller (not illustrated), controller wiring 38, transducer 39, ink reservoir 35 and inking probe 36, as well as the components used to operably connect the transducer 39 to the ink reservoir 35 for the dispensing of ink from the ink reservoir 35 through the inking probe 36, may be conventional, with one novel aspect of the present invention being the facility for manually adjusting the inking head 32 in vertical relationship with respect to the semiconductor wafer 40. It is further understood that various mechanisms known by those skilled in the art, other than the rack-and-pinion arrangements heretofore described, may be used to effect horizontal adjustment of the horizontal adjusting plate 3 on the base plate 2; angular adjustment of the angular adjustment arm 20 with respect to the horizontal positioning plate 3; and vertical adjustment of the inking head 32 on the vertical adjustment bracket 24.

Referring next to FIGS. 5–8, in typical application the inking apparatus 1 of the present invention is positioned on a supporting surface 44 typically adjacent to a wafer chuck or other wafer support 42 at an inking station in a semiconductor manufacturing facility. A semiconductor wafer 40, having had multiple dies 41 previously fabricated and tested thereon, is positioned on the wafer support 42 for marking of defective dies 41 thereon by operation of the inking apparatus 1. Accordingly, the inking head 32 of the apparatus 1 is positioned above the appropriate defective die 41 by operating the horizontal positioning knob 4 and the angular adjustment knob 16. The horizontal positioning knob 4 is rotated in the clockwise direction to advance the inking head 32 over the wafer 40, such as to the position illustrated in FIG. 7, or rotated in the counterclockwise direction to retract the inking head 32 back toward the edge of the wafer 40, such as to the position illustrated in FIG. 5. The angular adjustment knob 16 is rotated in the counterclockwise direction to move the angular adjustment arm 20 and thus, the attached inking head 32, laterally and define a selected angle "+θ" with respect to the longitudinal axis of the angular adjustment arm 20, as illustrated in FIG. 8. Conversely, the angular adjustment knob 16 is rotated in the clockwise direction to move the angular adjustment arm 20 and attached inking head 32 to define a selected angle "−θ" with respect to the longitudinal axis of the angular adjustment arm 20. After the horizontal adjustment knob 4 and the angular adjustment knob 16 are rotated as appropriate to locate the inking head 32 above the appropriate defective die 41 on the wafer 40, the vertical adjustment knob 25 is rotated to lower the inking head 32 through the vertical adjustment bracket 24 and thus, facilitate contact of the inking probe 36 with the die 41. Next, the inking controller (not illustrated) is operated to dispense ink from the ink reservoir 35 through the inking probe 36 and onto the die 41 to mark or label the die 41 as defective. After each of the defective dies 41 is inked, the inking head 32 is first raised on the vertical adjustment bracket 24 by counterclockwise rotation of the vertical adjustment knob 25 and moved to other locations on the wafer 40 to mark additional defective dies 41 thereon. This is accomplished by manual manipulation of the horizontal positioning knob 4 and the angular adjustment knob 16 in the clockwise or counterclockwise direction in the manner therefore described.

While the preferred embodiments of the invention have been described above, it will be recognized and understood that various modifications can be made in the invention and the appended claims are intended to cover all such modifications which may fall within the spirit and scope of the invention. It will be appreciated by those skilled in the art that the horizontal positioning knob 4 and angular adjustment knob 16 are effective in quickly and precisely positioning the inking head 32 at a defective die 41 located at any position on the wafer 40.

What is claimed is:

1. An inking apparatus comprising:
   a base plate;
   a horizontal positioning plate horizontally adjustably carried by said base plate;
   an inking head carried by said horizontal positioning plate; and
   an angular adjustment arm pivotally carried by said horizontal positioning plate for lateral adjustment with respect to said horizontal positioning plate, and wherein said inking head is provided on said angular adjustment arm.

2. The inking apparatus of claim 1 further comprising a horizontal positioning knob operably engaging said horizontal positioning plate for horizontally adjusting said horizontal positioning plate on said base plate.

3. The inking apparatus of claim 1 further comprising an angular adjustment knob operably engaging said angular adjustment arm for laterally adjusting said angular adjustment arm with respect to said horizontal positioning plate.

4. The apparatus of claim 1 further comprising a vertical adjustment bracket carried by said horizontal positioning plate and wherein said inking head is vertically adjustably mounted in said vertical adjustment bracket.

5. The inking apparatus of claim 4 further comprising an angular adjustment arm pivotally carried by said horizontal positioning plate for lateral adjustment with respect to said horizontal positioning plate and wherein said vertical adjustment bracket is provided on said angular adjustment arm.

6. An inking apparatus comprising:
   a base plate;
   a horizontal positioning plate horizontally adjustably carried by said base plate;
   an inking head vertically adjustably carried by said horizontal positioning plate; and
   an angular adjustment arm pivotally carried by said horizontal positioning plate for lateral adjustment with respect to said horizontal positioning plate and wherein said inking head is provided on said angular adjustment arm.

7. The inking apparatus of claim 6 further comprising a vertical adjustment bracket carried by said horizontal positioning plate and wherein said inking head is vertically adjustably mounted in said vertical adjustment bracket, and further comprising a vertical adjustment knob operably engaging said inking head for vertically adjusting said inking head in said vertical adjustment bracket.

8. An inking apparatus comprising:
   a base plate;
   a horizontal positioning plate horizontally adjustably carried by said base plate;
   an angular adjustment arm pivotally carried by said horizontal positioning plate, said angular adjustment arm laterally adjustable with respect to said horizontal positioning plate;
   a support arm carried by said angular adjustment arm;
   a vertical adjustment bracket carried by said support arm; and
   an inking head vertically adjustably carried by said vertical adjustment bracket.

9. The inking apparatus of claim 8 further comprising a vertical adjustment knob operably engaging said inking head for vertically adjusting said inking head in said vertical adjustment bracket.

* * * * *